United States Patent [19]

Spilo

[11] Patent Number: 5,831,987
[45] Date of Patent: Nov. 3, 1998

[54] METHOD FOR TESTING CACHE MEMORY SYSTEMS

[75] Inventor: Michael L. Spilo, New York, N.Y.

[73] Assignee: Network Associates, Inc., Santa Clara, Calif.

[21] Appl. No.: 664,509

[22] Filed: Jun. 17, 1996

[51] Int. Cl.[6] .................................................. G06F 11/00
[52] U.S. Cl. ..................................... 371/21.2; 395/183.18
[58] Field of Search .................................. 371/21.2, 25.1, 371/27.5; 395/185.08, 183.18, 183.12, 103.01, 431, 497.03, 445, 185.01, 183.07

[56] References Cited

U.S. PATENT DOCUMENTS

| | | | |
|---|---|---|---|
| 5,497,458 | 3/1996 | Finch et al. | 395/183.06 |
| 5,511,180 | 4/1996 | Schieve | 395/497.03 |
| 5,513,344 | 4/1996 | Nakamura | 395/185.18 |
| 5,524,208 | 6/1996 | Finch et al. | 395/183.01 |

*Primary Examiner*—Robert W. Beausoliel, Jr.
*Assistant Examiner*—Nadeem Iqbal
*Attorney, Agent, or Firm*—Darby & Darby P.C.

[57] ABSTRACT

A method for testing cache memory components of a computer system. The method tests RAM by detecting whether external memory caching can be disabled via software, and if not, the RAM is tested in segments large enough to ensure overflow of the primary L1 and secondary L2 CPU cache memory. The size of the L1 and L2 cache memories are measured by timing memory access speeds in Kb/Sec of successively larger blocks of memory. Additionally, a method for testing a particular region of system memory is provided, even if the memory region is in use by the operating system, which is accomplished by creating an isolated environment that switches the operating system off and on for each pass of the memory test.

11 Claims, 4 Drawing Sheets

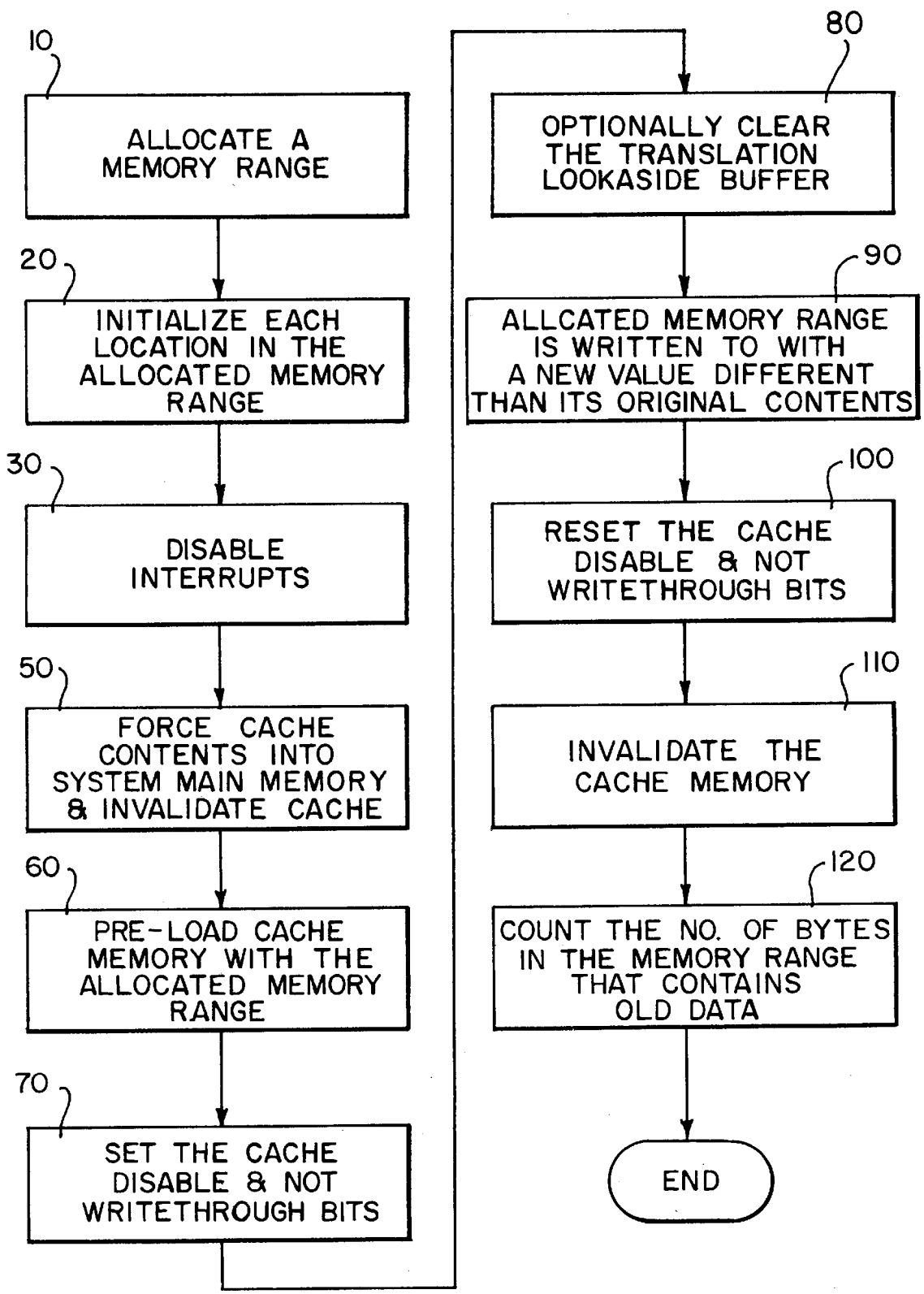

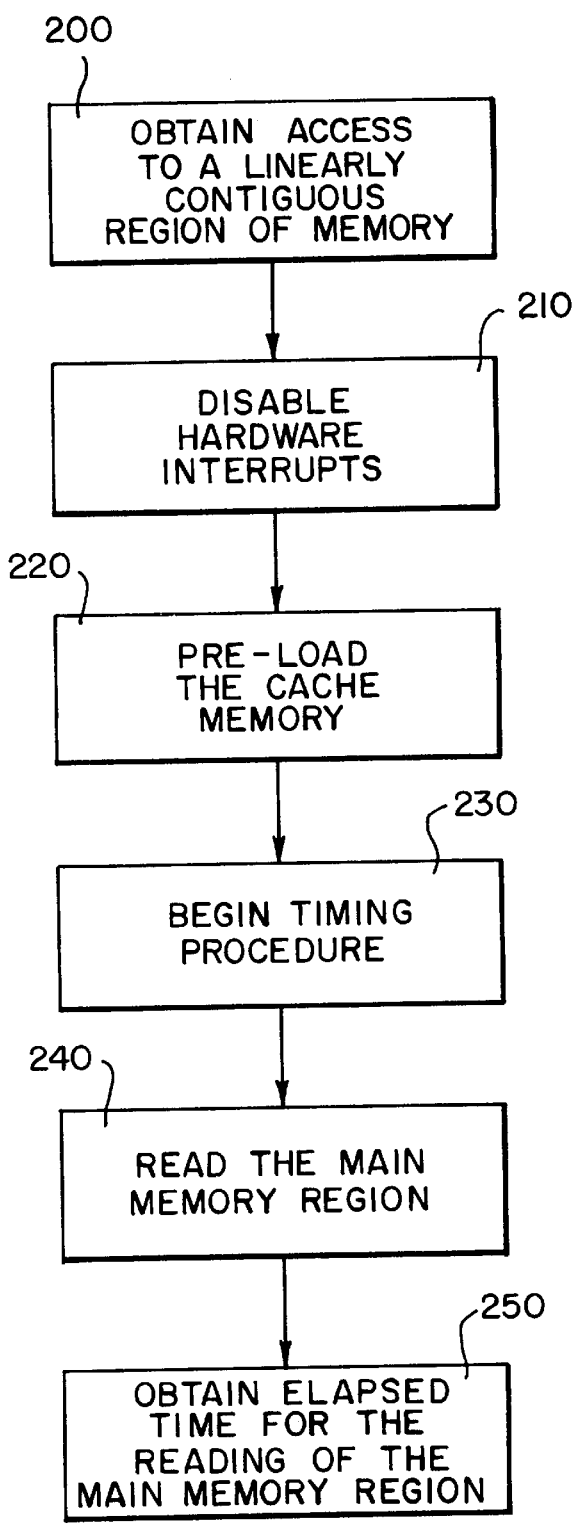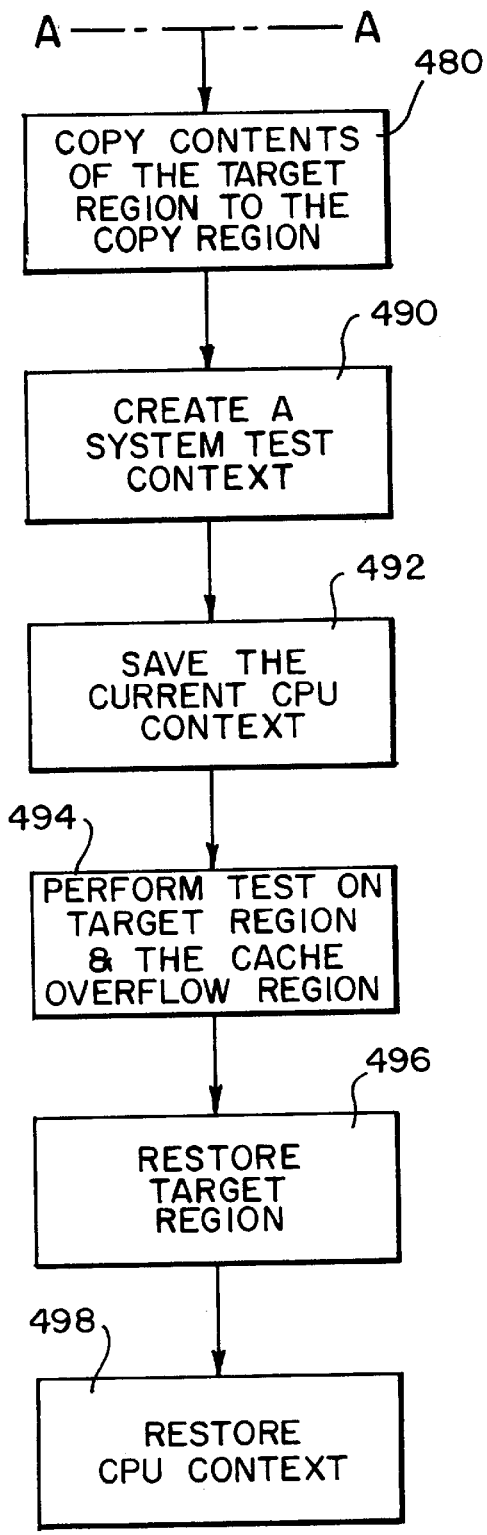

METHOD FOR TESTING CACHE MEMORY SYSTEMS

This invention relates to a method of testing memory components of a computer system. More particularly, the invention relates to a method of testing CPU cache memory in a micro-computer system.

BACKGROUND OF THE INVENTION

Modem computer systems are required to manipulate and store increasingly larger amounts of code and data. One method that is commonly used to speed up memory/accesses in computer systems is to utilize cache memory. Cache memory is very fast memory that is interposed between a CPU and slower RAM memory. Cache memory is composed of Static Random Access Memory (SRAM) in which data is stored in tiny transistors that are in a wafer of semiconductor memory. SRAM is expensive compared to relatively slower Dynamic Random Access Memory (DRAM).

A typical caching mechanism is either integrated directly into the CPU (known as primary, first level, or L1) or located in between the CPU and DRAM (known as secondary, second level or L2) in the computer system, and sometimes in both places. For instance, in the INTEL PENTIUM Pro family of CPU's, some CPUs have both L1 and L2 caches built into the CPU housing. These cache sub-systems provide faster access to a small part of the CPU's direct storage by keeping recently accessed regions or by pre-loading RAM regions based on a given access. Different CPU's and systems may house different amounts of cache RAM and therefore provide differing levels of performance.

Since cache memory is relatively expensive, there have been a growing number of instances in which the cache memory content of a computer system has been falsely represented. For example, the German computer magazine C't reported in its January 1996 publication that fake, non-functioning Static RAM chips were being sold in Europe. Similarly, in the United States there have been numerous reported instances of re-labeling and re-packaging schemes which mislead the consumer regarding the contents of the purchased computer system, particularly the cache memory components.

Due to the high level of technical knowledge needed to detect the type of memory components employed in a computer system, it is relatively easy to mistake or misrepresent these components. A system user who has been sold a given system may possibly be receiving a falsely labeled lower-cost CPU which contains less cache memory, a system which contains cache memory chips that are inactive, or system memory of inadequate speed required by the design characteristics of the system. Therefore, a need has developed to verify, preferably through software, both the functionality and integrity of various computer system components.

Prior art testing methods have been written and designed by hardware manufacturers to test their own systems. Such tests are beneficial, particularly in the Power-On-Self-Test (POST) performed by system BIOS. But such tests are of little value to a user trying to determine if a given system of unknown origin is operating correctly because the POST in a generic (non-brand name) system may disabled or ineffective, and because such tests are by nature very brief, they often do not show problems that would occur through more frequent, prolonged use. Furthermore, the POST is often not able to detect the difference between different brands of CPU's. For example, if a user is under the impression that the purchased computer system has an INTEL CPU, the POST may not determine that the CPU is not an INTEL CPU, but in fact is a CPU manufactured by AMD. Thus, the differences in the internal structure of the CPU are not tested or reported properly by the above prior art.

Another prior art attempt to test the functionality of various computer system components relates to a variety of commercially available system test programs. An example of these programs include WINCHECKIT by TOUCHSTONE, QA PLUS by DIAGSOFT, NORTON DIAGS by SYMANTEC and etc. These test programs tend to test memory in small amounts, such as 4K or less, and although some actually do fairly extensive pattern testing, they ignore the existence of L1 and L2 caches, and simply test "memory." This kind of testing will frequently fail to show problems in the actual system RAM, because errors will be masked by the cache RAM.

It is further noted that the above mentioned prior art has another drawback of requiring direct access to all tested RAM. Therefore, this precludes performing tests in a high level operating system environment, such as MICROSOFT WINDOWS.

Therefore, it is an object of the invention to provide a method for testing computer system components which overcomes the drawbacks of prior art methods.

SUMMARY OF THE INVENTION

The invention is an improved method for testing memory components of a computer system. The invention provides a method for testing RAM by detecting whether external memory caching can be disabled via software, and if not, the RAM is tested in segments large enough to ensure overflow of the primary L1 and secondary L2 CPU cache memory. The size of the L1 and L2 cache memories are measured by timing memory access speeds in Kb/Sec of successively larger blocks of memory. Alternately, when testing CPU's manufactured by INTEL, memory measurements are determined by utilizing the Cache Disable (CD) bit and No Writethrough (NW) bits. The invention also provides a method for testing a particular region of system memory, even if the memory region is in use by the operating system. This is accomplished by creating an isolated environment that switches the operating system off and on for each pass of the memory test.

BRIEF DESCRIPTION OF THE DRAWINGS

These and other objects of the invention will become apparent from the detailed description below and the accompanying drawings in which:

FIG. 1 is a flow diagram depicting the process used for determining the size of cache memory in accordance with the invention;

FIG. 2 is a flow diagram depicting the process used for determining the size of cache memory using timing techniques in accordance with the invention;

DETAILED DESCRIPTION OF THE INVENTION

Figure 3:
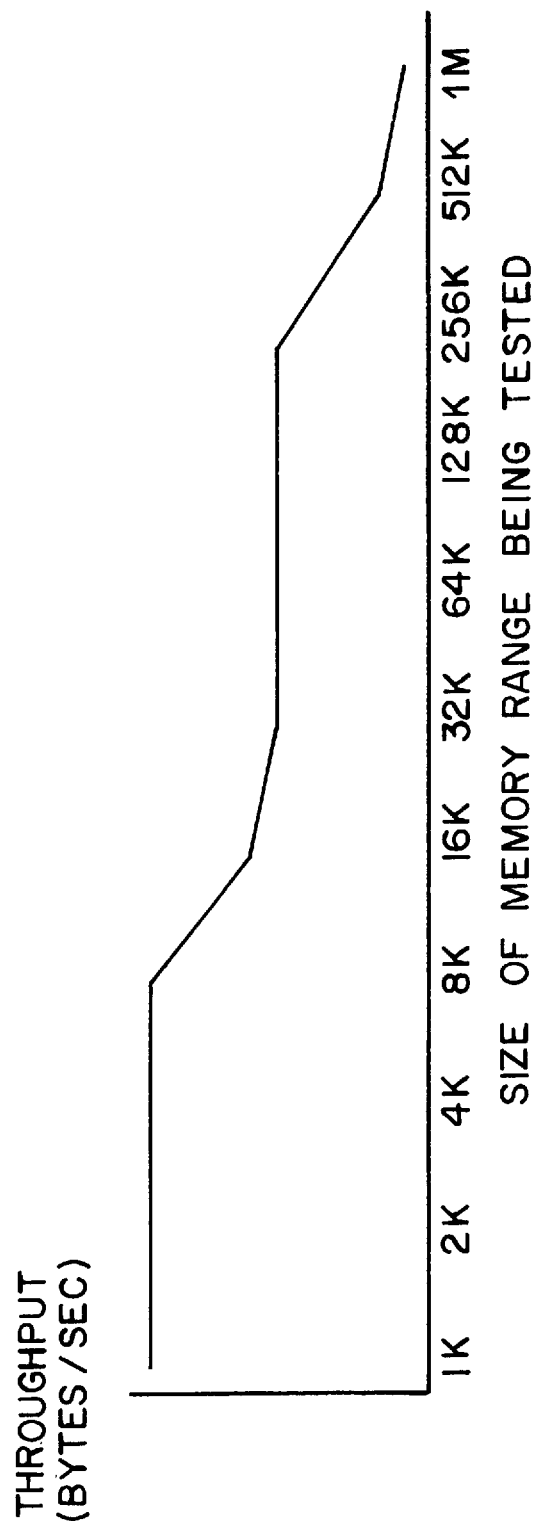
FIG. 3 is a graph depicting averaging timing results using the process of FIG. 2.

The invention provides for CPU cache size determination by utilizing unusual behavior of the Cache Disable and Not Writethrough bits of a CPU. In brief, the invention first checks the CPU type to ensure these bits are properly supported, and then attempts to test the L1 cache using Cache Disable (CD) and Not Writethrough (NW) bits. It is noted that the invention is intended to be implemented in various micro-computer systems, such as those incorporating an INTEL CPU. It is to be appreciated that the invention is described in conjunction with an INTEL CPU for exemplary purposes only, as the invention is not to be understood to be limited thereto but rather may be incorporated with numerous types of CPU's As noted in the handbook for the INTEL 486 Processor, it is stated that if the CD and NW bits are activated the "Caching is disabled, but valid cache lines continue to respond . . . writes to valid cache lines update the cache but do not update main memory." In this regard, experimentation has proven that writing to any memory region that is cached, when both the CD and NW bits are enabled, causes the data being written to be written to the cache memory but not to the system RAM that is being cached.

With reference to the flow diagram of FIG. 1, in order to utilize the above described CPU behavior to determine the cache size, the invention allocates preferably a 64K physical memory range in the main memory of the computer system (step 10). This memory range need not be physically contiguous, but must be linearly contiguous. It is noted that a 64K physical memory range was chosen because, at present there are no known CPU's having an L1 cache that is larger than 32K. However, the memory needed must be larger than the maximum potential size of the cache being tested. The invention also initializes the memory to an original value, whereby this step may be performed at any time (step 20). The interrupts are next disabled to ensure that code or data outside of the test will not execute while the CPU cache is in an intermittent state (step 30).

Next the invention causes the CPU to write its current cache contents to system main memory, and invalidate its current cache contents using the WBINVD instruction (step 50). The writing of the cache memory to the system memory and the subsequent invalidating of the cache memory ensures that the pre-loading of the cache memory will result in maximum cache coverage.

The CPU is then exercised to cause the cache controller to pre-load the cache memory with the allocated memory range through a loop that repeatedly accesses the allocated memory region (step 60). This forces the cache memory to cache data in the memory region that was allocated. Sufficient passes and patterns are used to ensure maximum coverage of the main memory by the cache. Preferably the invention makes eight passes of read operations at the main memory, but other values may be used for different situations.

Next, the CD and NW bits are set (step 70). The Translation Lookaside Buffer (TLB) is then caused to be cleared by re-loading the CR3 register (step 80). It is noted that clearing the TLB has shown to provide better results through forcing the CPU to recalculate each memory access and cache address, but is not required. The entire allocated memory region is then written to with a value different from the original contents of the allocated memory region (step 90). This causes the CPU to place the data into the CPU cache but not into system memory for regions that are already covered by the cache address lines. The CD and NW bits are then reset (step 100) and the cache memory is invalidated (step 110) without writing the contents of the cache memory back to system RAM using the INVD instruction. Thus, the RAM region contains the new value that was written in all locations not covered by the cache, and the old value for all regions covered by the cache. In order to determine the size of the cache, the number of bytes in the memory range that contains the old data is counted and is rounded up to the next higher possible cache size (usually a power of 2k or 1k increments) to determine the size of the L1 cache (step 120).

A code procedure for performing the above described method for determining the L1 cache size in a MICROSOFT WINDOWS environment is as follows.

```
VMMCall _PageAllocate <32, PG_SYS, 0, 0, 0, 0, 0, PageLocked>
        mov         ecx,eax
        or          ecx,edx
        jz          gcds_nocache
        push        eax
        push        edx
        mov         ebx,1024*64 / 4        ;number of DWORDS we have
        pushfd
        cli
        cld
gcds_size_loop:
        mov         esi,8                  ;passes
        mov         eax,cr0                ;get current cr0
        WBINVD                             ;write data invalidate
gcds_load_cache:
        mov         edi,edx
        mov         ecx,ebx
gdcsll: cmp         dword ptr ds:[edi],0
        add         edi,4
        dec         ecx
        jnz         gdcsll
        dec         esi
        jnz         gcds_load_cache
        mov         ebp,eax
        or          eax,60000000h          ;set CD & NW (see INTEL manuals)
        mov         cr0,eax
        mov         eax,cr3
        mov         cr3,eax                ;TLB cleared
        mov         edi,edx
```

```
        mov             ecx,ebx
gdsc12: mov             dword ptr ds:[edi],-1
        add             edi,4
        dec             ecx
        jnz             gdcs12
        mov             cr0,ebp                 ;re enable normal operation
        INVD
        mov             edi,edx                 ;point at region
        mov             ecx,ebx                 ;get number of dwords
        xor             ebx,ebx                 ;zero cache size
gdcs13: cmp             dword ptr ds: [edi], 0
        jne             short gdcs14
        add             ebx,4
gdcs14: add             edi,4
        loop            gdcs13
        popfd
gdcs_dealloc:
        pop             edx
        pop             eax
        VMMCall         _PageFree, <eax, 0>
gcds_nocache:
        pop             ebp
        add             ebx,3ffh
        add             ebx,not 3ffh
        mov             eax,ebx
```

With reference to the flow diagram of FIG. 2, determination of the size of the CPU cache memory through timing techniques by utilizing low level timing capabilities present in computer systems will now be described. It is noted that the method of the invention preferably uses the system timers at their highest resolution and provides a subroutine to time the access speed of reading successive double word memory values.

Initially, the invention finds and obtains access to a suitable range of memory to test (step 200). This range must contain physical RAM, be cacheable by the system and be linearly contiguous. It is noted that in a WINDOWS based disk operating system, this can most easily be accomplished by obtaining a linear address that provides a one-to-one physical mapping of linear memory to physical memory. In order to gain the maximum possible amount of contiguous RAM, the invention allocates this mapping beginning at 1 Mb. Since only read times are checked, the invention does not need to own the memory being tested.

Next, the hardware interrupts are disabled in order to prevent stray activity in the system from diverting cache memory away from the test procedure, thus affecting the timing (step 210). The memory range being tested is then pre-read to pre-load cache memory to ensure that the timing mechanism will read from cache memory wherever possible (step 220). The pre-reading process must occur at least once prior to the timing of the memory range, but for best results, the invention pre-reads the range twice to maximize the chance that the desired range is being cached. It is preferred that the pre-reading be accomplished as closely in the code to the timing loop in order to minimize the portion of cache memory that may be devoted to caching program code rather than memory under test.

Next, the method of the invention begins a timing procedure (step 230), reads the desired memory range (step 240), and obtains the time elapsed for the reading of the memory range (step 250). A code procedure for initiating such a method for determining the size of the CPU cache memory through timing is as follows.

```
        movzx           ecx,[ebp].client_dx     ;get size of test in Kb
        shl             ecx,10
        push            ecx
        VMMCall         _MapPhysToLinear <1024*1024, ecx, 0>
        pop             edx
        inc             eax
        jz              gat_error
        dec             eax
        mov             esi,eax
        pushfd
        mov             ebx,3
        shr             edx,2
        cli
gat_preload_loop:
        mov             ecx,edx
        mov             esi,eax
gat_pre_load_cache:
        mov             edi,[esi]               ;read memory
        add             esi,4
        loop            gat_pre_load_cache
        dec             ebx
        jnz             gat_preload_loop
        mov             esi,eax
        mov             ecx,edx
        mov             ebx,eax
        shl             edx,2
        add             ebx,edx
        call            starttimmer
gat access_loop:
        mov             eax, [esi]
        add             esi,4
@@:     loop            gat_access_loop
        call            stoptimer
        popfd
        jmp             return_dword
```

This timing procedure is repeated for blocks of memory that are successively doubled in size, starting at a low value (typically 1K or 2K) and proceeding to a value larger than the largest possible L2 cache size (typically 2 Mb). Doubling is not absolutely required, but each successive size must be sufficiently larger to ensure a large drop in time vis a vis the previous size. Since cache memory is typically packaged in sizes that are some power of 2, size doubling is preferred.

Multiple timings are performed for each memory size, and an average throughput in Kb read per second is computed for each size. The invention, for consistency purposes, checks that no timing for a given range is more than plus or minus four percent from the average timing value. If a timing inconsistency is found, the timing procedure is then repeated for the current memory size. The average timings are then compared with each other. If a drop in throughput of at least twenty percent is detected in between adjacent timings, then a cache has been exceeded by the increase in memory, and the cache boundary lies between the sizes.

For example, the graph of FIG. 3 depicts the average timing results as they would approximately appear in a computer system having an 8K L1 cache and a 256K L2 cache. It is noted that the large dropoffs in throughput between 8K and 16K, and between 256K and 512K is due to a significant reduction in the L1 cache effectiveness. The smaller dropoffs at 16K to 32K and at 512K to 1 Mb are due to a further reduction of the effect of a small cache on a large range of memory.

The following code illustrates the use and computation of average throughput and determination of the actual cache size.

```
for(j = 1;j<= 2048;j *=2)
  tryagain:
    kpsavg[k] = 0;
    for(I = 0; I < NumCachelters; + +I) {
      asm mov dx, j
      asm mov ax,DISC_Time_Mem_Access
      ticks = (DWORD) Discover_ VXD();
      kps[1] = ((DWORD) j) * 1193200 / ticks;
      kpsavg[k] + = kps[i];
    kpsavg[k]/= NumCachelters;
    for(I = 0; I< Num Cachelters; + +I)
      if( (kps[i] < (kpsavg[k] − (kpsavg[k]/ 25)))
          (kps[i] > (kpsavg[k] + (kpsavg[k]/25))) )
          goto tryagain;
    size = ((DWORD) j) * 512I;
    if(k)
      if((kpsavg[k] > (kpsavg[k−1] + (kpsavg[k−1] , 5)))) {
        if(L1CacheSize)
          /*check if L1CacheSize computed by other means */
          if( L1CacheSize < size ) {
            L2CacheSize = size;
            break;
          } .
        } else {
          L1CacheSize = size;
          if( (ThisCPU = = CPU_386SX) (ThisCPU = = CPU _386DX) ){
            break;
          }
        }
      }
      ++k;
    }
```

In order to test the caches and the underlying RAM as independently as possible, the method of the invention uses several different procedures. But, in all cases the memory sizes of the L1 and L2 caches must be determined first. Second, a determination is made as to whether L1 and/or L2 caches can be disabled via software. A variety of known software methods for disabling the caches may be used. For example, such methods may include setting the CD bit in CR0, activating the PCD bit (as described in the INTEL 486 Programmer's Reference handbook) in the page table entry for the memory being timed, and attempting to disable the cache via CMOS or through BIOS calls as may be available on some computer systems. After each attempt to disable the cache, the sizing procedure described above is attempted again, in order to verify that the caches have been disabled.

If the CPU supports the CD/NW procedure, the invention uses a similar procedure to test the L1 Cache. First, a main memory region larger than the L1 cache is allocated, and the interrupts are disabled. The main memory region is initialized with a given data value and the cache is flushed (WBINVD) and then loaded with the allocated memory region. The CD and NW bits are then set in CR0 and the TLB is preferably flushed.

Next, the invention loads the allocated main memory region with a test pattern, and then immediately reads the allocated main memory region to verify the loading. Preferably, these writes and reads can be done in varying patterns to verify the cache response.

If a mismatch is detected, the location of the mismatch is saved, and a fixed value that is different from the original initialization value is written to the entire memory region (assuming the last test pattern was not complete). The cache is then invalidated (INVD) causing the cache contents to be discarded. The mismatching location is then examined. If the mismatch location contains the new fixed value, then the error is in the RAM or the L2 cache. If the mismatching location contains the original initialization value, then the failure is in the L1 cache.

If the CD/NW procedure is not available, then the invention tests the L1 cache by performing a standard read/write memory test in a given pattern on a region that is only slightly larger than the measured size of the L1 cache. This ensures that the cache will be fully exercised.

If the L2 cache can be disabled, and the sizing test has verified that the L2 cache is disabled, then testing of system RAM can proceed by disabling the L1 cache (using CD+NW+WBINVD) and testing the memory in any given size amounts. If, the L2 cache cannot be disabled, the invention disables the L1 cache and allocates a region that is larger than the size of the L2 cache, and adds in the test region to the allocated L2-size region and tests the entire memory space of the two regions, thus ensuring that the L2 cache will overflow.

Figure 4A:
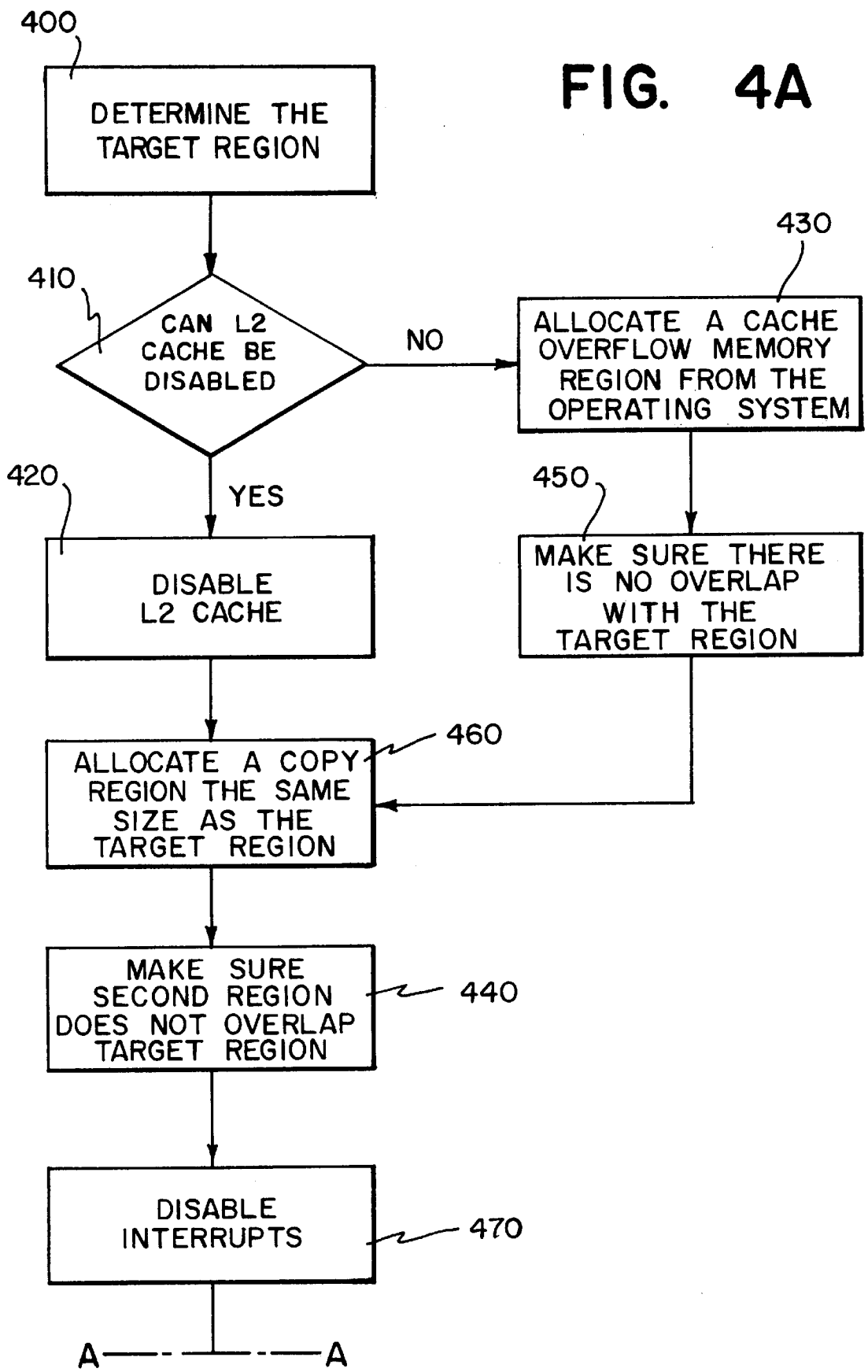
FIG. 4 is a flow diagram depicting a testing method for independently testing cache memory and system RAM in accordance with the invention.

With reference to FIG. 4, invention performs the test as follows. The target region is determined (usually starting at the bottom physical address and proceeding up) (step 400). If the L2 cache can be disabled (step 410), it is then disabled (step 420), and the invention performs the test as described below, not including the cache overflow region.

If the L2 cache cannot be disabled, the invention allocates from the operating system a memory region that is slightly (typically 4K or 8K) larger than the size of the L2 cache (cache overflow region) (step 430). The invention verifies that the target region does not overlap the cache overflow region (step 440), and if it does, the invention re-issues all or part of the allocation as needed (step 450), although any method for verifying that the cache overflow region does not contain any of the pages of the target region may be used.

The invention then allocates a second region (copy region) that is the same size as the target region (step 460), (again verifying and ensuring that there is no overlap, step 440) and then disables interrupts (step 470) and copies the contents of the target region to the copy region (step 480). Copying to the copy region may be done after a context switch, but to minimize the time during which interrupts are disabled, is preferably done before a context switch. The invention then creates a system test context that consists of a memory mapping that allows access to the allocated region, the target region, the copy region and the test code (step 490). The invention then saves the current CPU context including all CPU registers in a manner that is accessible to the test code and may be restored by the test code (step 492).

Next, the invention switches to the test context in which both the L1 cache and interrupts and if possible the L2 cache are disabled and performs a test on the target region and the cache overflow region, if any, saving the location and type of any error encountered (step 494). The test is performed by writing and then verifying a test pattern to the target region together with the cache overflow region, if any. Once the test is complete, the invention restores the contents of the target region from the copy region (step 496), and switches the context back to the saved context (step 498).

In order to determine whether any errors are related to the cache or to actual RAM, the test is repeated. If errors occur in the same memory range, but not in others, the problem is in the System RAM, while a problem that reoccurs in different test regions is a cache problem. The invention tests the entire memory in discreet steps, wherein the test region is relatively small, so as to minimize the time spent with interrupts disabled.

Regarding the testing of L2 cache, the invention follows a similar procedure as described above, except that neither a target region nor a context switch are needed. Therefore the invention allocates a region that is larger than the determined L2 cache size, disables the interrupts, disables and flushes the L1 cache, and tests the target region. However, if a not-writethrough setting is available for the L2 cache through system settings, then this capability is activated, and the test proceeds as described above. A verification of errors can then be done by examining the RAM after the writethrough has been re-enabled to determine whether the cause is the underlying RAM.

Although the invention has been described with emphasis on particular embodiments for testing cache memory, it should be understood that the figures are for illustration of exemplary embodiments of the invention and should not be taken as limitations or thought to be the only means of carrying out the invention. Further, it is contemplated that many changes and modifications may be made to the invention without departing from the spirit and scope of the invention as disclosed.

What is claimed is:

1. A method for determining the size of primary CPU cache in a computer system having cache memory and main memory, the method comprising the steps of:

reserving a contiguous linear memory region within the main memory of the computer system;

initializing each location in the memory region to a first value;

invalidating the contents of the cache;

preloading the cache with the memory region;

placing the cache in a state such that CPU commands to read and write memory that is cached are serviced by the cache and not the main memory;

writing a second value to each location of the linear memory;

placing the cache in its normal operating state;

invalidating the cache without writing its contents back to the main memory; and determining the size of the cache by reading values stored at all locations in the linear memory and counting the number of locations that have the first value as compared to the second value.

2. A method for determining the size of a CPU cache in a computer system having a cache memory, main memory and a system timer, the method comprising the steps of:

obtaining read access to a linearly contiguous region of the main memory of a given size;

pre-loading the cache with the main memory region;

reading the main memory region a subsequent time;

obtaining the time elapsed for said subsequent read of the memory range;

obtaining successively larger linearly contiguous regions of the main memory;

computing the rate of CPU reads in bytes per second for each sized main memory region using the obtained elapsed time; and establishing the CPU cache size as a function of a detected threshold memory region size whereby sizes larger than the threshold correspond to lower rates of CPU reads per second and sizes less than the threshold correspond to higher rates of CPU reads per second.

3. A method of claim 2 wherein the CPU is an INTEL 386 CPU, the method further including the step of flushing the translation lookaside buffer of the INTEL 386.

4. A method of claim 2, further including the step of disabling interrupts.

5. A method of claim 2, wherein the elapsed time is obtained by reference to a system timer.

6. A method for testing the primary cache in a computer system having a cache and main memory, the computer system capable of being placed in an active non-write through mode, the method comprising of:

determining the size of the cache;

allocating a memory region in the main memory larger than determined size of the cache;

writing a first memory value to each location of the allocated memory region of the computer system;

invalidating the contents of the cache;

exercising the CPU to cause the cache to be loaded with the contents of the allocated memory region;

placing the cache in a state such that CPU commands to read and write cached memory are serviced by the cache and not the main memory;

writing a second memory value to each location of the allocated memory region; and reading each location of the allocated memory region to verify that each location contains the correct first and second memory value.

7. A method of claim 6, further comprising performing the writing and reading steps a plurality of times using different second memory values in different address access patterns.

8. A method for testing a portion of system RAM in a computer System having a CPU, main memory and cache memory, the method including the steps of:

determining the size of the cache memory;

allocating a region of the main memory larger than the determined size of the cache memory;

ensuring the allocated main memory region does not overlap the portion of the system RAM to be tested;

writing a test pattern to allocated main memory region and to the system RAM to be tested;

reading each location in the main memory region and the system RAM to be tested; and comparing the read results of the main memory region and the system RAM to be tested with the test pattern.

9. A method of claim 8, wherein the contents of the system RAM to be tested are first saved to a third region which does not overlap either the allocated main memory region or the system RAM to be detected.

10. A method of claim 1, wherein preloading is done by accessing all of the memory region at least one time.

11. A method of claim 2, wherein preloading is done by accessing all of the memory region at least one time.

* * * * *